(12) United States Patent
Geddes, III (10) Patent No.: US 10,845,709 B2
(45) Date of Patent: Nov. 24, 2020

(54) SYSTEM AND METHOD FOR INDUSTRIAL SCALE CONTINUOUS HOLOGRAPHIC LITHOGRAPHY

(71) Applicant: Photia Incorporated, Livermore, CA (US)

(72) Inventor: Joseph Bernhardt Geddes, III, Berkeley, CA (US)

(73) Assignee: Photia Incorporated, Livermore, CA (US)

( * ) Notice: Subject to any disclaimer, the term of this patent is extended or adjusted under 35 U.S.C. 154(b) by 212 days.

(21) Appl. No.: 15/980,362

(22) Filed: May 15, 2018

(65) Prior Publication Data

US 2018/0329309 A1 Nov. 15, 2018

Related U.S. Application Data

(60) Provisional application No. 62/506,442, filed on May 15, 2017.

(51) Int. Cl.
*G03H 1/04* (2006.01)
*G03F 7/20* (2006.01)
(52) U.S. Cl.
CPC ...... *G03F 7/70325* (2013.01); *G03F 7/70308* (2013.01); *G03F 7/70408* (2013.01); *G03F 7/70725* (2013.01)

(58) Field of Classification Search
CPC ...... G02B 5/18; G02B 5/1847; G02B 5/1852; G02B 5/1857; G02B 5/28; G02B 27/42; G02B 27/44
USPC ....... 359/572, 566, 569, 576, 900, 558, 577, 359/35, 1, 10, 11, 28; 216/24
See application file for complete search history.

(56) References Cited

U.S. PATENT DOCUMENTS

| | | | | |
|---|---|---|---|---|
| 5,142,385 A | * | 8/1992 | Anderson | G03F 7/001 250/201.9 |
| 6,839,142 B2 | * | 1/2005 | Isshiki | G03F 7/70775 356/498 |
| 6,882,477 B1 | * | 4/2005 | Schattenburg | G03F 7/70383 359/35 |
| 7,304,775 B2 | * | 12/2007 | Hobbs | G03F 7/70408 359/1 |

* cited by examiner

*Primary Examiner* — Arnel C Lavarias
(74) *Attorney, Agent, or Firm* — Alpine Patents LLC; Brian Van Osdol (57) ABSTRACT

A system and method for patterning of a substrate at sub-micron length scales using interference lithography that includes a substrate; a chuck that promotes substrate motion; at least two EM beams; a beam phase controller, wherein the phase controller modifies phases of the EM beams with respect to each other creating an interference pattern; a displacement sensor that measures the substrate displacement; and a feedback control mechanism configured to monitor and synchronize the substrate motion with the interference pattern using the beam phase controller and the displacement sensor.

12 Claims, 7 Drawing Sheets

SYSTEM AND METHOD FOR INDUSTRIAL SCALE CONTINUOUS HOLOGRAPHIC LITHOGRAPHY

CROSS-REFERENCE TO RELATED APPLICATIONS

This Application claims the benefit of U.S. Provisional Application No. 62/506,442, filed on 15 May 2017, which is incorporated in its entireties by this reference.

TECHNICAL FIELD

This invention relates generally to the field of holographic lithography, more specifically to a new and useful system and method for high throughput, industrial scale continuous holographic lithography.

BACKGROUND

Holographic lithography (also referred to as interference lithography) is a technique for patterning regular arrays of fine features, without the use of complex optical systems and photomasks. In holographic lithography an interference pattern is generated between two or more coherent light waves and transferred to a typically photosensitive material (e.g. photoresist). The interference pattern comprises a periodic series of intensity minima and maxima created by constructive and destructive interference of the light waves. The period of the spacing for two light waves is given by $(\lambda/2)/\sin(\theta/2)$, where X is the light wavelength and $\theta$ is the angle between the two interfering waves. Using this pattern, a 3-beam interference pattern may be used to generate patterns with 2D symmetry, and 4-beam interference patterns may generate patterns with 3D symmetry.

Figure 2:
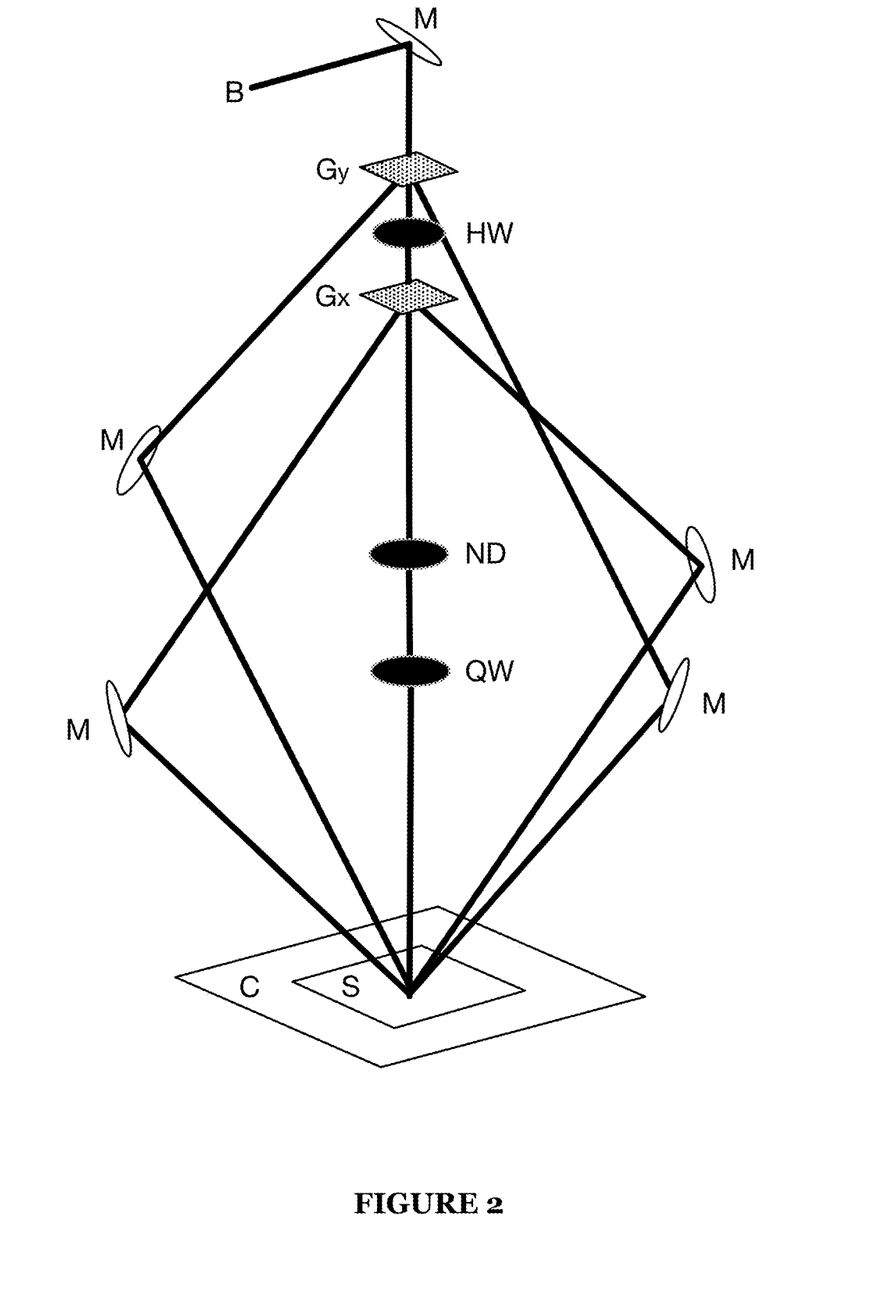
FIG. 2 is an exemplary representation of one conventional stationary holographic lithography embodiment.
Figure 3:
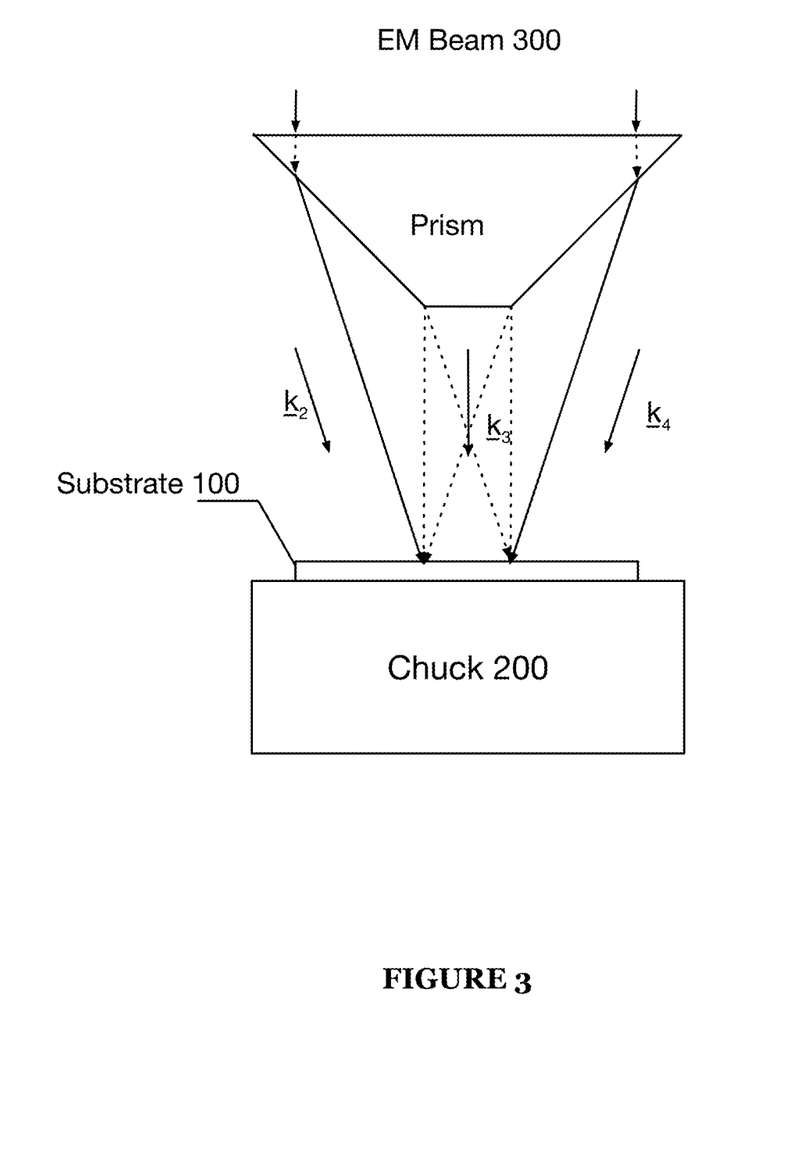
FIG. 3 is an exemplary representation of one embodiment (front view) of the system, common to some active, passive, and hybrid phase control methods.

To create precise interfering patterns, beam coherence is important. Using broad bands of light create "smearing" effects of the interference pattern. For this reason, monochromatic light is typically used in holographic lithography. The band width of a light beam is typically narrowed using diffraction gratings and beam splitters that diffract at different angles for different wavelengths and thereby dissipating unwanted wavelengths. Often holographic lithography may be used as an initial step to create a master structures for subsequent micro processes. Holographic lithography is used to create and modify metals, ceramics, and polymers, and is commonly used in the fields of photovoltaics and biotechnology. FIG. 2 shows an example of conventional holographic lithography in which the photomaterial is stationary. A photoresist-coated substrate S is rigidly attached to chuck C. Gratings G splits the input beam B, the results of which are directed by mirrors M to interfere at the substrate, forming latent image LI. Half- and quarter-wave plates (HW, QW) set the beam polarizations while the neutral density filter ND sets the relative amplitude of the central beam. As seen in the figure, the substrate is fixed in place.

A photoresist is a light sensitive material used in many processes to transfer patterned coatings to a surface. A photoresist is created by coating a substrate with a light-sensitive material (typically organic). A patterned mask may additionally be applied onto the surface of the photoresist to protect regions of the substrate that should not be exposed to light. The photo is then exposed to light, wherein the regions exposed to light are washed away leaving only the masked areas behind. Alternatively negative photoresist substrates also exist, wherein the regions exposed to light become cross-linked and harden. A solvent is then used to wash away the regions that were masked. Examples of possible photoresist materials include tbutoxycarbonyl (t-BOC), methyl methacrylate, diazonaphthaquinone (DQ), and diazonaphtoquinone (DNQ). Photoresists are most commonly sensitive in the ultraviolet (<450 nm) spectrum but alternate photoresists with lower or higher sensitivities do exist.

A drawback of interference lithography is that it is limited to patterning arrayed features uniformly, making it difficult to create complex and arbitrary shapes. Masking of the substrate (i.e. covering/coating the substrate with a light protective layer) can aid in this process, but still inhibit the production of complex structures. Current technologies lack the combination of fine control and speed to produce three-dimensional nanostructured materials in a cost-effective manner and/or at scale.

Another drawback of current interference lithography is the inability to pattern large substrates with continuous patterning. Moving either the substrate or the interference pattern typically leads to smearing out of the interference pattern. Current technologies have not developed a dynamic method for implementing holographic lightography.

Thus, there is a need in the holographic lithography field to create a new and useful system and method for high throughput, industrial scale continuous patterning holographic lithography. This invention provides such a new and useful system and method.

DESCRIPTION OF THE EMBODIMENTS

The following description of the embodiments of the invention is not intended to limit the invention to these embodiments but rather to enable a person skilled in the art to make and use this invention.

1. Overview

A system and method for the application of holographic lithography of a preferred embodiment functions to enable three-dimensional (3D) holographic lithography, more specifically continuous holographic lithography, at an industrial scale. The system and method preferably enable continuous patterning of a substrate in one, two, or three spatial dimensions at a sub-micron scale. In particular, the system and method is preferably used in connection with holographic nanolithography but may alternatively be used with holographic lithography approaches to enable patterning at larger scales such as at scales of tens to hundreds of microns. Four or more optical beams overlapping may create a three-dimensional interference pattern in a photosensitive material, herein referred to as a photomaterial. The photomaterial may be a photoresist or other substance which changes properties in response to electromagnetic (EM) radiation. The photomaterial may be coated onto a substrate attached to a moving chuck or processed in a continuous format such as roll to roll.

The phase (or other property) of one or more of the optical beams is coordinated with the motion of the photomaterial so that the resulting interference pattern is motion-synchronized with the photomaterial and produces a sharp, high contrast latent image. Herein, motion synchronized characterizes object state coordinated with motion of the photomaterial as a form of cooperative motion. Control of the interference can be motion-synchronized. Additionally position of a mirror can be motion-synchronized as may be used in a passive variation as described herein. Subsequent processing develops the latent image into a three-dimensional morphology. It should be noted that a minimum of two or three noncoplanar beams can be used to create one- or two-dimensional structures, respectively.

Coordination of the optical phase control with the moving photomaterial to the accuracy required for making continuous features is a major difficulty for the problem confronted here, particularly at the micron and sub-micron levels. Even small differences between the velocity of the photomaterial and interference pattern can smear out the latent image. The system and method employ phase control methods to solve this synchronization problem. A passive method which "auto-synchronizes", an active method which consists of dynamically modifying the phase to maintain synchronization, and a combined hybrid of the passive and active method may each be used to overcome the synchronization problem between the optical phase control and the motion of the photomaterial substrate.

All three phase control methods function to create a moving interference pattern. The active, passive, and hybrid methods have various advantages. The passive approach has an advantage of relative simplicity and the potential for self synchronizing or automatic alignment in some embodiments. The active approach has an advantage of increased programmability and easier scalability. The hybrid approach incorporates advantages of both the active and passive methods. It should be noted that the system and method are capable of altering the phases, amplitudes, wave vectors, coherence, and/or polarizations of the optical beams dynamically. This can be accomplished by using optical modulators, wherein the system may include one or more optical modulators acting on one or more EM beams. A sequence of optical modulators or any suitable configured optical system may act on one or more EM beams. The optical modulators can preferably be dynamically controlled using the active approach, a passive approach, and/or a hybrid approach. For example, the system may additionally include a polarization and/or amplitude optical modulator. Alternatively, a single optical modulator may be used in altering a set of optical properties. Note modulators can operate on different principles, for example electro-optic, acousto-optic, or another suitable mechanism. Modulators can act on more than one beam. Multiple modulators with different principles of operation for altering phase or other beam properties can be used. Beams can also be modulated by scattering from a mask, other mirror, or diffraction grating which could be mounted to the chuck or on another mechanical actuator.

The system and method may afford many advantages over currently used holographic lithography techniques. Structures of high precision may be created efficiently and in large scale. Dependent on substrate material and thus interference pattern wavelength, substrate units of at least 150 nm long may be patterned. When patterning a substrate into porous structures, pore sizes of at least 10 nm (to approximately 120 nm) can be generated within the substrate (with the practical maximum limit being approximately 80% of the subunit length, and the minimum subunit length is $\lambda/2$). The phase of the optical beams may be adjusted in real time, making the interference pattern motion-synchronized and allowing for a high level of precision in pattern formation upon the substrate. With continuous motion of the substrate, the system and method allow for an industrial scale modification of substrate units that has not been previously available in today's market.

As another potential benefit, the continuity of the patterning may give the invention an advantage over conventional projection, contact, proximity, interference, and holographic lithography, which are serial techniques. Continuous patterning with conventional methods requires an overlapping series of discrete or scanning beam exposures using multiple passes, which are difficult to implement. For example photolithography currently requires 50 passes to create a CMOS integrated circuit. The system and method can enable continuous patterning of arbitrary lengths of a photomaterial.

As another potential benefit, the system and method may additionally enable formation of gradient patterns into the substrate using a spatial light phase modulator. The system and method further allow the use of multiple optical beams at different wavelengths. Both multiple beams and multiple continuous passes enable the invention to potentially generate more complex patterns at sub-micron levels of precision with greater efficiency. A general weakness of holographic lithography has been the lack of ability to generate complex patterns. Complex structures may serve advantages in the field of semi-conductors and building of MEMS that is a region where until currently holographic lithography has not been employed. Additionally, the construction of porous structures may have application in the design and construction of chromatography filters.

As another potential benefit, the method may be faster and simpler than conventional lithographic methods that create three-dimensional structures layer by layer. These methods operate by building up a three-dimensional structure out of layers that have essentially one or two-dimensional structure. The method also avoids the problems of alignment with which layer by layer approaches must contend. Photonic crystals have application in thin-film optics of lenses and in optical computers and are currently built in this layering fashion. Thus photonic crystals may be generated more efficiently and with fewer defects as compared to current methods.

As another potential benefit, the invention does not require a mask (though some embodiments could incorporate one), which is an advantage over many conventional lithographic techniques that do. These include conventional photolithography, nanoimprint lithography, and rolling mask lithography. Methods dependent on masks need a new mask to be made for each new pattern or material structure that is developed. Developing a mask at sub-micron scales has its own difficulties, while generating an appropriate interference pattern can be done very precisely using computers to generate the proper theoretical interference pattern and then employing these patterns with precise and coherent lasers.

As another potential benefit, the system and method allow for creation of structures with sharp features or smoother features using real time phase adjustment. By changing the phase modulation in small increments, the sharp contrast of the interference pattern may be smoothed out creating more curved (as opposed to sharp edged) patterns. Smooth shapes may be useful in the field of optics, and aid in creating precise sub-micron lenses at an industrial scale.

2. System

Figure 1:
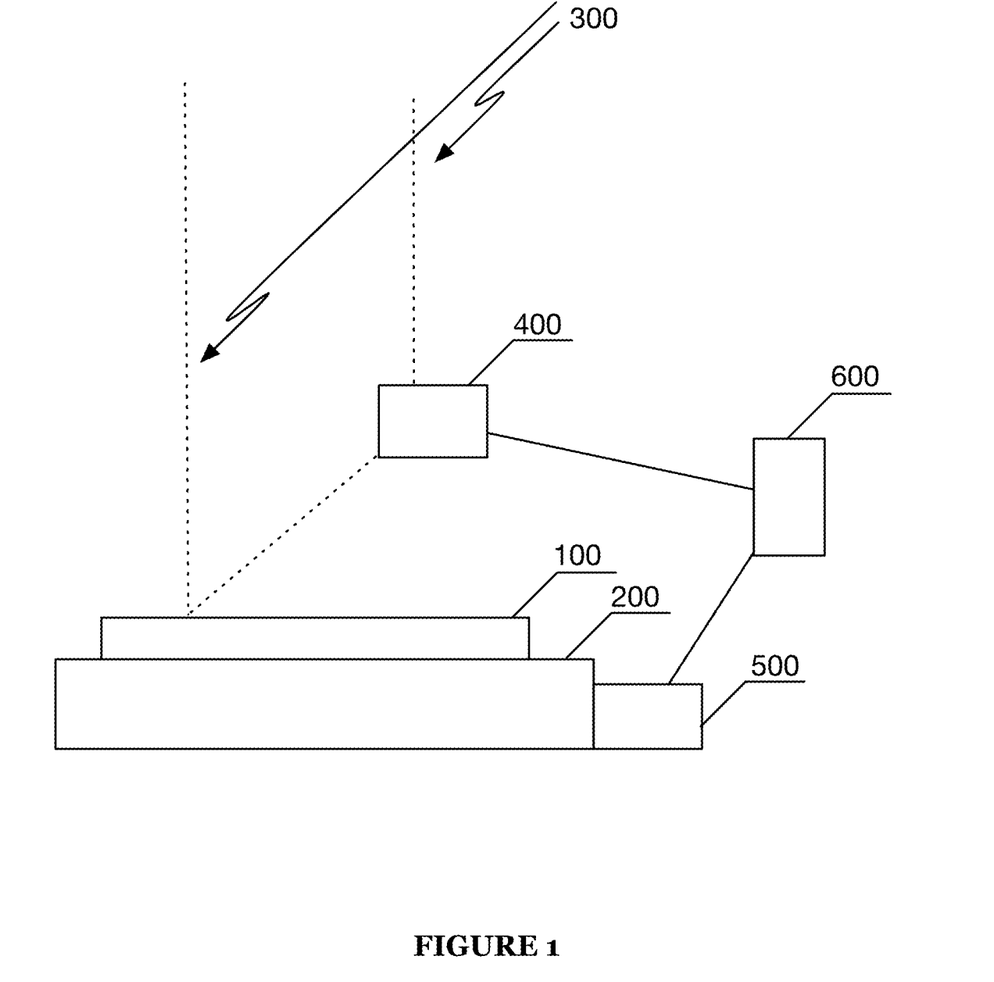
FIG. 1 is a schematic representation of a system of a preferred embodiment.

As shown in FIG. 1, a system for patterning of a substrate at sub-micron length scales using interference lithography, of a preferred embodiment, can include a substrate 100; a chuck 200 that may promote substrate motion; at least two EM beams 300; a beam phase controller 400, that may alter the phase difference between the at least two EM beams creating an interference pattern; a displacement sensor 500, that measures the substrate displacement; and a feedback control mechanism 600, that monitors and synchronizes the interference pattern with respect to the substrate motion, using the beam phase controller 400 and the displacement sensor 500. The system functions to create a pattern on or into the substrate 100. The system may be customized to create patterns in multiple dimensions (i.e. 1D, 2D, or 3D) and create patterns of differing complexity (e.g. periodic patterns, gradients, or arbitrary patterns).

The substrate 100 of a preferred embodiment functions as the material to be modified. The substrate may be thin enough such that light can penetrate completely through (e.g. typically a maximum thickness of approximately 1 mm). In a preferred example, the substrate 100 is a positive photosensitive material such that Electromagnetic (EM) beams 300 of, or near, a particular wavelength will degrade the material. The substrate 100 may alternatively be composed of a negative photosensitive material (i.e. light reinforces the substrate) or not photosensitive at all. In some preferred implementations the photosensitive substrate 100 may be a photoresist such as a base substrate coated with light-sensitive organic material. Light exposure causes a photochemical reaction which changes the solubility of the photoresist in response to light absorption, thereby generating a latent image. For example, in a negative photoresist, such as SU-8, light absorption leads to cross linked regions which remain upon immersion in developer. Post-exposure processing, including postbaking and development, reveals the three-dimensional polymer nanostructure. The photoresist substrate 100 may thereby be "patterned" by exposing the substrate 100 to an interference pattern created by EM beams 300 of the appropriate wavelength. Alternatively, for a non-photosensitive substrate 100, the EM beams 300 may be used to etch out a shape into the substrate 100.

In some examples the substrate 100 may be photosensitive at multiple wavelengths. Photosensitivity may be either positive, negative, or any combination of the two. Photosensitivity at multiple wavelengths may allow the substrate 100 to be patterned using multiple interference patterns simultaneously (in the case of positive sensitivity) or allow for higher precision of patterning by protecting certain areas of the substrate 100 while patterning adjacent areas of the substrate 100 (e.g. by protecting regions of the substrate 100 by exposing the substrate 100 to the negative sensitive wavelength adjacent to the positive sensitive wavelength interference pattern).

A more comprehensive material palette can be exploited by using the patterned photoresist substrate 100 as a template. Methods such as electroplating or chemical vapor deposition can be used to deposit other materials into the defined void space (i.e., patterned cavity) of the patterned photoresist which can then be removed. In this way the substrate 100 can be used as mold, template, or scaffold. The photoresist can be removed after the deposition of other materials, for example by etching, burning, or possibly evaporation. Alternatively, the substrate 100 could instead be a functional photo-material. This material remains after development and forms a functional part of the structure. Further deposition of other materials in and onto the already functional structure is also possible.

In some variations, the substrate 100 could be a non-solid substrate such as a photosensitive fluid or gas in which light exposure causes material deposition or hardening. That is EM radiation may cause either material to collect into a specific pattern on or within the substrate 100, or the substrate itself may undergo a phase transition and solidify into a specific pattern.

The chuck 200 of a preferred embodiment functions as a stabilizer and actuator for the substrate 100. The chuck 200 preferably uses a suitable actuator system that functions to promote chuck actuation in one or more dimensions. Chuck actuation may enable the substrate to be modified during motion, allowing for long continuous modification of a single substrate, allowing high through put assembly line type substrate modifications to a single substrate traveling through multiple modification areas in series, and/or allowing for a line of substrate subunits to be modified in rapid succession.

The substrate 100 may preferably be rigidly attached to the chuck 200 and move with the chuck actuation. Chuck actuation may occur from nanometer to micron length scales. Alternatively chuck actuation may occur at other length scales. Chuck actuation may be at a constant rate, or may vary as necessary. Chuck 200 motion is preferably automated and controlled from an external interface. The actuating motion of the chuck 200 may be in 1, 2, or 3 dimensions. The actuating motion may be translational, rotational, or any other combination of motion.

The chuck 200 may additionally provide stability to the substrate 100. The chuck 200 may help provide a strong rigid structure to hold the substrate 100 fast with minimal external effects. The chuck itself may be made of very sturdy material such that fluctuations due to thermal and vibrational energies within the chuck 200 may be much less than the sub-micron rate of motion of the chuck.

The electromagnetic (EM) beams 300 of a preferred embodiment function to generate the pattern that is then transferred upon the substrate. The EM beams 300 may directly create the pattern upon the substrate by radiating particles upon the substrate, but may alternatively cause a change to the photoresist substrate 100 to change solubility. Preferably the EM beams 300 create an interference pattern around a specific wavelength that creates the pattern upon the substrate. To create an interference pattern the EM beams 300 need to have relatively close or exactly the same wavelength, thus EM beam 300 coherence is important to create the interference pattern. The closer the wavelengths of the EM beams 300 are, the sharper the interference pattern generated by the EM beams 300 becomes. Thus alternatively two or more EM beams 300 that are relatively dissimilar (but close enough to interfere with each other) may be used to create less sharp patterns, "smeared" patterns.

Patterns created upon the substrate may be 1, 2, or 3 dimensional. To create a pattern in 1D, at least two EM beams are required. To create a pattern in 2D, at least three EM beams are required. To create a pattern in 3D, at least four EM beams are required. That is, a minimum of N+1 beams are preferably used to create interference patterns in N dimensions. Additional EM beams may be used to create more complex structures and/or to more efficiently pattern the substrate.

The phase controller 400 of a preferred embodiment functions to change the phase of a subset of the EM beams 300 to generate and control the shape of the interference pattern. As the substrate actuates through the interference pattern the phase controller 400 may modulate the phase of the EM beams to "move" the interference pattern such that the interference pattern stays fixed with the same interference profile upon the same location of the substrate 100. That is to say, the peaks and valleys of the interference profile may stay fixed upon the substrate 100 due to the phase controller 400 changing the phase of the subset EM beams 300 and thus shifting the interference pattern. The phase controller 400 may preferably change the phase in real time. The phase controller 400 is preferably made up of phase modulators placed along the path of the EM beams 300 Examples of phase modulators may include of electro-optic, liquid crystal, acousto-optic, or thermal. The phase controller 400 may alternatively change the EM beam phase by lengthening or shortening the distance that the EM beam travels to reach the substrate.

The displacement sensor 500 of a preferred embodiment functions to measure the chuck 200 movement/displacement during operation, thereby measuring the substrate 100 movement/displacement and/or velocity (e.g. interferometer). The displacement sensor 500 may be any type of sensor that can accurately measure nanometer lengths or larger. The displacement sensor may be directly or indirectly connected to the feedback control mechanism 600. The displacement sensor 500 may be interferometric type using light, but alternatively could operate via mechanical, inertial, or other mechanism.

The feedback control mechanism 600 of a preferred embodiment functions to adjust the interference pattern generated by the EM beams 300 such that the interference pattern is motion-synchronized with the substrate, enabling continuous and precise patterning of the substrate 100. The feedback control mechanism 600 may use information from the displacement sensor 500 to determine the motion of the substrate 100 and may control the phase controller 400 to respectively adjust the EM beams' phases to maintain the motion-synchronized interference pattern. In a preferred variation a motion-synchronized interference pattern may be maintained by adjusting the generated electric field of the interference pattern such that the electric field is moving at the same velocity as the substrate actuation. Alternative variations may be used. Maintaining a motion-synchronized electric field is just one variation to maintain a motion-synchronized interference pattern. Other dynamic phase, amplitude, wave vector, coherence, and/or polarization variations may be engineerable to create a moving interference pattern that result in a three-dimensional latent image after exposure. Two implementations of the feedback control mechanism 600 (a passive and an active mechanism) will be presented after the underlying mathematical model for the feedback control is explained.

A mathematical model of the general physics underlying the formation of the optical interference pattern and consequent generation of the latent image highlights key features and limitations of conventional holographic lithography. For illustrative purposes, the optical beams here may be approximated as plane waves. The electric field $\underline{E}$ as a function of position $\underline{r}$ and time t is the linear superposition of these plane waves:

$$\underline{E}(\underline{r},t) = Re(\underline{A}_m \exp(i[\underline{k}_m \cdot \underline{r} - \omega t + \phi_m])), \quad (1)$$

where $\omega$ is the angular frequency, Re indicates the real part, i is the imaginary unit, and $\{\underline{A}_m, \underline{k}_m, \phi_m\}$ denote each plane wave's amplitude vector, wave vector, and phase, respectively ($m = \{1, 2, 3, 4\}$). The specific absorption rate SAR, which quantifies the exposure process in forming the latent image, is then $$SAR(\underline{r}) = \varepsilon_o \omega Im(n)((1/2)\Sigma_m \underline{A}_m \cdot \underline{A}_m + \Sigma_m \Sigma_{(m' \neq m)} \underline{A}_m \cdot \underline{A}_{m'} \cos((\underline{k}_m - \underline{k}_{m'}) \cdot \underline{r} + (\phi_m - \phi_{m'}))), \quad (2)$$

where $\varepsilon_o$ is the permittivity of vacuum, and n is the complex refractive index of the photomaterial at the frequency of interest (corresponding typically to visible or ultraviolet wavelengths in vacuum, though other wavelengths may be used depending on the photomaterial employed). Judicious choice of the $\{\underline{A}_m, \underline{k}_m, \phi_m\}$ allows for periodic structures having any of the 14 Bravais lattices to be created. (One- and two-dimensional gratings can also be made with two or three interfering optical beams, respectively.)

Current methods for holographic lithography have critical limitations. Since the interference pattern and hence the specific absorption rate are both stationary, the volume of the nanostructured materials made during each exposure is limited by the width of the interfering optical beams. A series of exposures can be used to pattern adjacent areas of photomaterial, but these patterned areas will in general not be continuous (there will be stitching errors that must be minimized).

Holographic lithography may be extended for making larger continuously nanostructured material. Although the interference phenomena described by (2) can be used to create a wide variety of three dimensional nanostructures, in practice the volume of patterned material is limited. A means to manufacture continuously patterned nanostructures wider than the interfering beams is needed. Suppose the phase $\phi_m$ of each plane wave, which heretofore was considered constant, instead varies with time as, $$\phi_m(t) = \varphi_m - (\underline{k}_m \cdot \underline{v})t, \quad (3)$$

where the $\varphi_m$ are constant and $\underline{v} = v\underline{u}_x$ is the velocity of the photomaterial (for example carried by a chuck); the Cartesian unit vectors $\underline{u}_x, \underline{u}_y, \underline{u}_z$. Then the electric field is $$\underline{E}(\underline{r},t) = Re(\underline{A}_m \exp(i[\underline{k}_m \cdot (\underline{r} - \underline{v}t) - \omega t + \varphi_m])), \quad (4)$$

whose dependence on the quantity $(\underline{r} - \underline{v}t)$ indicates continual lateral drift at the photomaterial velocity. Thus the electric field moves laterally in synchronization with the chuck and photomaterial. The interference pattern and latent image preferably moves laterally in synchronization with the chuck and photomaterial resulting in the desired latent image. In one example, when, $$(1/\omega)[Max(\underline{k}_m \cdot \underline{v}) - Min(\underline{k}_m \cdot \underline{v})] \ll 1, \quad (5)$$

a condition easily satisfied in the laboratory, the SAR is given by $$SAR(\underline{r},t) = \varepsilon_o \omega Im(n)((1/2)\Sigma_m \underline{A}_m \cdot \underline{A}_m + \Sigma_m \Sigma_{(m' \neq m)} \underline{A}_m \cdot \underline{A}_{m'} \cos((\underline{k}_m - \underline{k}_{m'}) \cdot (\underline{r} - \underline{v}t) + (\varphi_m - \varphi_{m'}))), \quad (6)$$

and so the interference pattern too moves laterally in sync with the chuck and photomaterial, thus enabling continuous nanopatterning. Note that this condition is just one example for certain embodiments of the invention. Other dynamic phase, amplitude, wave vector, coherence, and/or polarization variations are also possible to create a moving interference pattern that result in a three-dimensional latent image after exposure.

Figure 4:
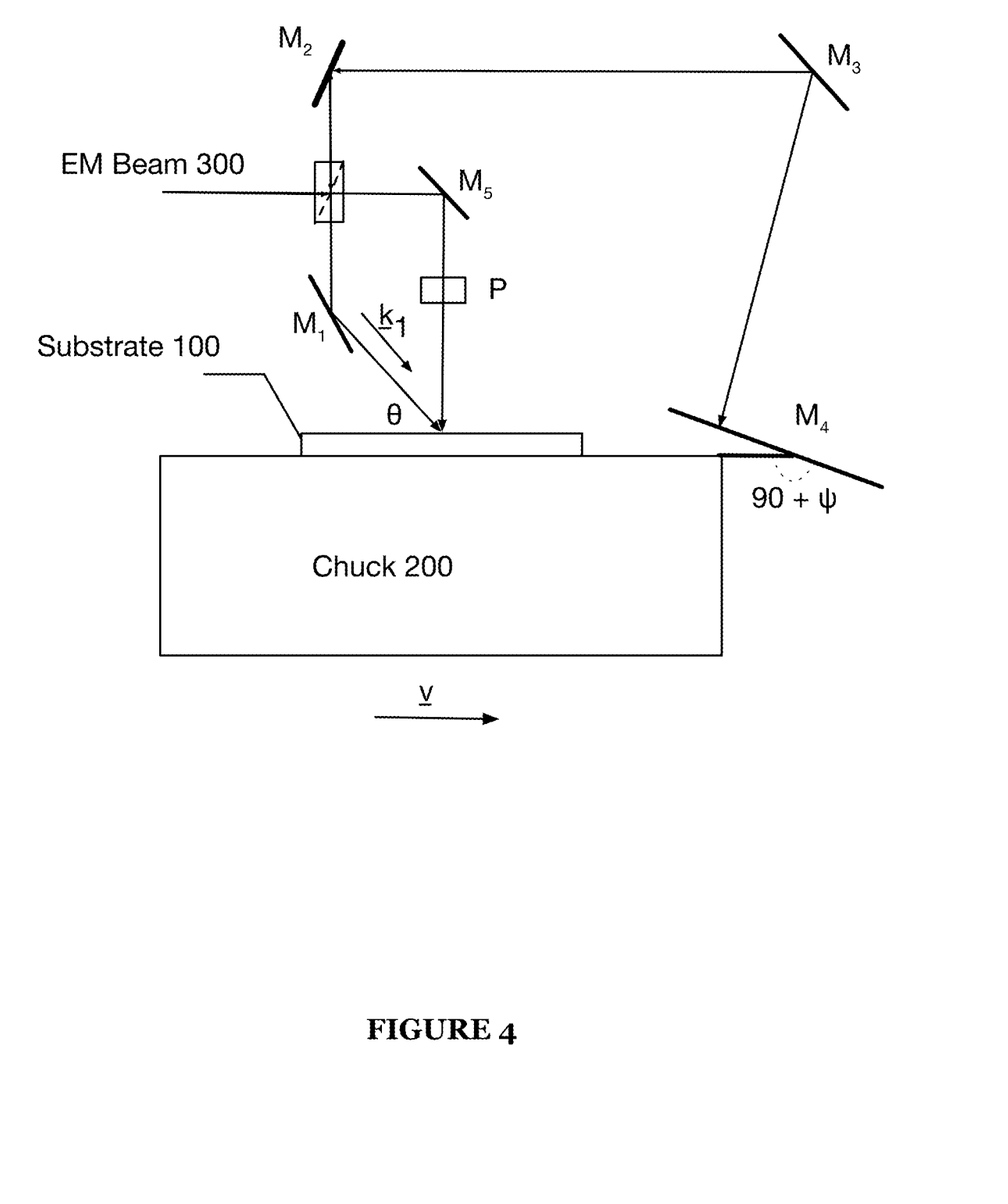
FIG. 4 is an exemplary representation of one embodiment of the system using passive phase control.
Figure 5:
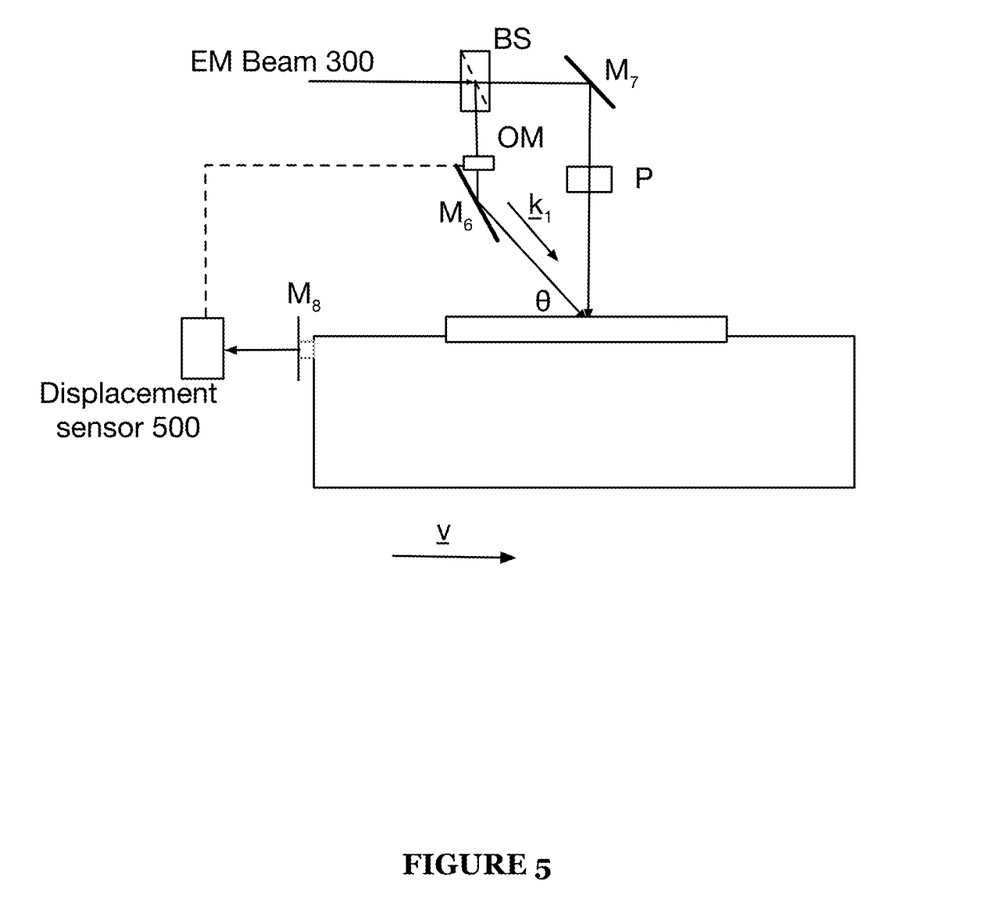
FIG. 5 is an exemplary representation of one embodiment of the system using active phase control.

Implementing an additional time-dependent phase shift for one (or more) of the plane waves in (3) such that the interference pattern takes the form (6) or other desired phase control condition is the key requirement for the feedback control mechanism. Two methods, an active and a passive approach, are shown in FIGS. 3, 4, 5, and 6). For illustrative purposes, we consider the fabrication of three-dimensional structures (although one- and two-dimensional structures can also be made with variants of the described methods). For both methods, four (or more) optical beams interfere to produce a three-dimensional interference pattern in the photomaterial substrate 100 attached to a chuck 200. As shown in FIGS. 4 & 5, one of the EM beams 300 may possess a wave vector with a component parallel to the chuck velocity ($\underline{k}_1 \cdot \underline{v} \neq 0$). The phase of this beam is synced to the motion of the photomaterial. In one embodiment, the other three EM beams are arranged so that their wave vectors lay in the plane perpendicular to the chuck velocity ($\underline{k}_{\{2,3,4\}} \cdot \underline{v} = 0$); see FIG. 3. These three beams can be created by modifying a single beam using a prism P, beam splitters, or other means. The passive method feedback control mechanism 600 utilizes reflection from a mirror phase controller 400 rigidly attached to the chuck 400, as shown schematically for one embodiment in FIG. 4. Alternatively the chuck 400 may be converted into a reflective surface. A substrate 100 is rigidly attached to a moving chuck 200 (or alternatively a substrate rigidly attached to the chuck). An optical EM beam 300 is split by a beam splitter BS. Part of the beam is directed by mirror M5 through a prism P to create three interfering beams with wave vectors in the y-z plane perpendicular to v, the chuck velocity in the y-x plane. Another part of the beam is directed by mirror M1 to have wave vector in the x-z plane and interfere with the other three beams in the photomaterial. Another part of the beam is routed by mirrors M2 and M3 and reflected from mirror M4 rigidly attached to the chuck, thereby acquiring a varying phase shift. The angle of the mirror M4 is adjusted so that the optical phase $$\phi_1(t) = \phi_1 - (\underline{k}_1 \cdot \underline{v})t, \quad (7)$$

thereby allowing the electric field (4) to be obtained (for the simple case in which photomaterial is refractive index matched to its surroundings). This phase control condition is achieved when, $$\cos \theta = 2 \cos \psi, \quad (8)$$

for the configuration and angles defined in the figure. This passive method has the advantage of relative simplicity. This method may be capable of varying the motion of the photomaterial during exposure to introduce programmability into the patterning. That is, the patterning can be varied based on a design. Note other phase control conditions can be designed and implemented, for example to compensate for refraction at the interface between the photomaterial and its surroundings. The mirror arrangement can be configured such that it is self synchronizing or automatically aligned. Alternatively, means to implement the passive method may take other forms.

The active method is shown schematically for one embodiment in FIG. 5. A substrate 100 is rigidly attached to a moving chuck 200. An EM beam 300 is split by beam splitter BS. Part of the split beam is directed by mirror M7 through a prism P to create three interfering beams with wave vectors in the y-z plane perpendicular to v, the chuck velocity. Another part of the beam is directed by mirror M6 to have wave vector in the x-z plane and interfere with the other three beams in the photomaterial. On the way this part of the EM beam 300 passes through optical phase modulator OM, thereby acquiring a varying phase shift controlled by feedback control mechanism 600 with information from displacement sensor 500 to satisfy condition (7), or other desired phase control condition depending on the configuration, is satisfied. The displacement sensor 500 shown in the figure is an interferometric type that measures by reflecting another beam from mirror M8 rigidly attached to the chuck, but alternatively could operate via mechanical, inertial, or other mechanism. The movement of the chuck 200 may be measured via by the displacement sensor 500 via interferometry and the phase $\phi 1$ may be adjusted dynamically using an electro-optic modulator or other modulator to achieve condition (7).

The active method may ultimately achieve more reliable and flexible phase control with fewer requirements to make critical alignments as compared to the passive approach, at the cost of a calibration of the phase modulator. Additionally, the method allows the photomaterial motion to be varied during exposure, in addition to the effects created by the optical modulators, to introduce programmability into the patterning. That is, the patterning can be varied based on a design.

The invention can dynamically alter the phases, amplitudes, wave vectors, coherence, and/or polarizations of the optical beams in a controlled way. This capability can be implemented using the phase controller 400 to vary the beams' properties (including spatial light modulators); alternatively, the mirror positions and angles could be varied. Active control also has the advantage that the material structure can be programmed during the exposure step. Alternatively, means to implement the active methods may take other forms as listed in the section on hybrid methods.

Figure 6:
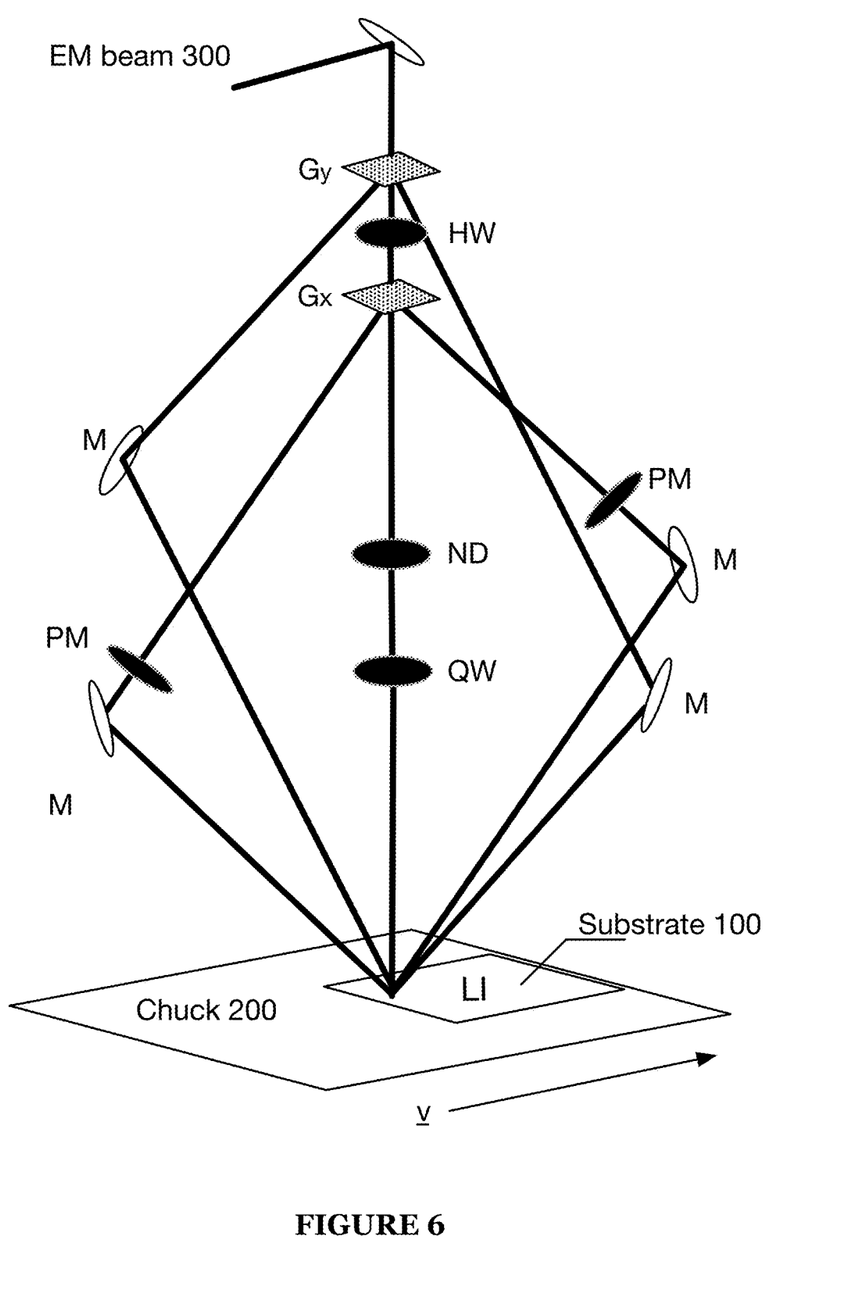
FIG. 6 is an exemplary representation of a preferred picture embodiment of the system.

FIG. 6 shows one additional embodiment. A photoresist-coated substrate 100 is rigidly attached to chuck 200 moving at velocity v. Gratings G split input EM beam 300, the results of which are directed by mirrors M to interfere at the substrate, forcing latent image LI. Phase modulators PM compensate for the chuck movement. Half- and quarter-wave plates (HW, QW) set the beam polarizations while the neutral density filter ND sets the relative amplitude of the central beam. The inset shows a computation of the interference pattern.

Note that different arrangements of optical beams are possible than those illustrated in the figures. For example, more than one beam can have a wave vector component parallel to the direction of the photomaterial velocity. Alternatively, all beams could propagate in the plane perpendicular to the motion of the photomaterial, and the signal driving the optical modulator in the active or hybrid methods can be rapidly changed to generate structure parallel to the photomaterial velocity.

3. Method

Figure 7:
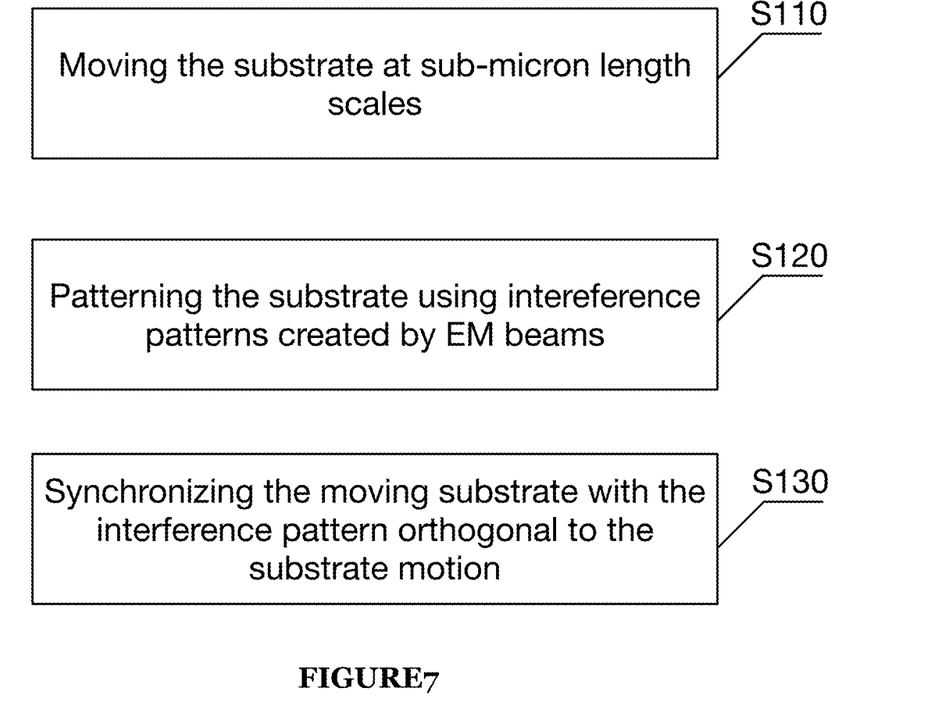
FIG. 7 is a flowchart representation of a method of preferred embodiment.

As shown in FIG. 7, a method for patterning of a substrate at sub-micron length scales using holographic lithography includes moving the substrate at sub-micron length scales S110, patterning the substrate using interference created by EM beams S120, and synchronizing the moving substrate with the interference pattern orthogonal to the substrate motion S130. The processes of the method are preferably performed simultaneously. The method is preferably implemented in connection with a system as described above, but any suitable system may alternatively be used.

Block S110, which includes moving the substrate at sub-micron length scales functions to enable continuous patterning of the substrate. Moving the substrate S110 may occur due to actuating of the substrate caused by the chuck. The substrate may be rigidly connected to the chuck, and is thereby actuated by the chuck actuation. Moving of the substrate may be translational, rotational, or a combination of the two. Moving of the substrate S110 may alternatively be considered to be in one, two, or three Cartesian dimensions. That is to say translational motion along a straight line would be movement in one Cartesian dimension, whereas moving along a circle would be movement along two dimensions in Cartesian dimensions.

Block S120, patterning the substrate using interference created by EM beams, functions to pattern the substrate. Patterning of the substrate may occur in one to three dimensions. For one dimensional patterning at least two coherent EM beams may be required, for two-dimensional patterning at least three coherent EM beams may be required, and for three-dimensional patterning at least four EM beams may be required. Since the beams must be coherent to create an interference pattern, patterning may comprise initially of splitting a single beam into multiple EM beams, adjusting the relative phase of the beams to create a preferred interference pattern, and then generating an interference pattern upon the substrate by recombining the EM beams.

Splitting a single beam into multiple EM beam functions to create multiple coherent beams. The closer the wavelength of the "coherent" beams are to one another, the sharper the interference pattern the EM beams may generate together. Splitting a single beam may occur using a beam splitter. Patterning the substrate S120 in one dimension requires at least two beams, patterning the substrate in two dimensions requires at least three beams, and patterning the substrate in three dimensions requires at least 4 beams; thus splitting a single beam to create a three-dimensional pattern may require the beam to be split into at least 4 beams.

Adjusting the relative phase of the beams with respect to each other is what determines the general shape of the interference pattern and is additionally what is used in synchronizing the moving substrate and motion-synchronized interference pattern.

Generating an interference pattern functions to create the interference pattern on the substrate that will be imprinted. One benefit of using optical interference to pattern the substrate is that masking of the substrate is not required. The constructive and destructive interference of the EM beams may automatically accomplish the task.

Generating an interference pattern may preferably generate a periodic pattern, as is typical for an interference pattern. Alternatively or simultaneously, a gradient pattern may be generated by implementing spatial light phase modulator and/or increasing or decreasing the amplitude of the EM beams. The amplitude may be adjusted by changing the power output of the EM beam, by adding or removing optical filters, splitting the EM beams, or by some other similar mechanism. More complex multi-periodic and/or arbitrary patterns may also be generated. Discrete beams may be implemented, where the distance over which the pattern can be changed is determined by the spot size of the region where the EM beams interfere. The spot size may then be decreased to make faster changes onto the substrate. Alternatively complex multi-periodic and arbitrary patterns may be generated using a Fourier expansion. Spatial light modulators (arrays of liquid crystals, electro-optic, MEMS, etc.) may be implemented to create and/or modulate beams. Distinct pairs of beams would form interference patterns that would contribute to one term of the Fourier expansion. Distinct pairs of beams may even function at distinct wavelengths, dependent on the substrate material. In addition, multiple exposures or scanning beam exposures may be used for the Fourier expansion (or to implement synthetic aperture lithography). Another variation for pattern generation may be an interference pattern in conjunction with a mask (contact, projection, or portable conformal). Although a mask may not be necessary for pattern formation, a mask may aid in creating complex patterns. A grating can be mechanically imprinted or made via photolithography or other method at the surface of the photomaterial prior to light exposure to create a portable conformal mask (amplitude, phase, or hybrid) that serves as a passive phase control method. In some variations patterns may be generated using pulsed EM sources that are phase locked to one another. EM beams that are not completely coherent may be used in variations where sharp contrasts are not preferred and "smoother". Alternate methods of pattern formation may also be implemented. Additionally, other alternative lithography schemes may be activated/deactivated and can be incorporated into the invention (multiple-wavelength, thermal, or other mechanism).

Block S130, synchronizing the moving substrate with the interference pattern orthogonal to the substrate motion functions to create a motion-synchronized interference pattern that enables continuous patterning of the substrate. Synchronizing the moving substrate with the interference pattern S130 may comprise of determining the velocity of the substrate, and modulating the EM beams phase difference such that the generated phase difference creates a motion-synchronized electric field, although alternative methods may be implemented. The theory for implementing the motion-synchronized electric field is preferably the theory previously described in above in the systems section and may be setup to function actively or passively.

Synchronizing the moving substrate with the interference pattern S130 passively includes attaching a fixed mirror to the substrate chuck as per FIG. 4 (or to another object that is motion-synchronized with the substrate). The mirror is preferably at least indirectly coupled to the substrate (e.g., through the chuck or some other mechanism). Fixing $\theta$ and $\psi$ as per equations (7, 8) will then synchronize interference pattern and the motion and of the substrate. Alternatively instead of mirrors, the chuck, substrate, or some other motion-synchronized object could be reflective and act as a mirror or grating to create additional beams to interfere in the photomaterial.

Alternatively, synchronizing the moving substrate with the interference pattern S130 may be done actively as described previously. By modulating the phase of a subset of the EM beams, and coupling the modulation to the substrate motion.

As a person skilled in the art will recognize from the previous detailed description and from the figures and claims, modifications and changes can be made to the embodiments of the invention without departing from the scope of this invention as defined in the following claims.

I claim:

1. A system for patterning of a substrate using interference lithography comprised of:
   a substrate;
   a chuck that promotes substrate motion;
   at least two electromagnetic beams;
   a beam phase controller, wherein the phase controller modifies phases of the electromagnetic beams with respect to each other creating an interference pattern;
   a displacement sensor that measures a substrate displacement; and
   a feedback control mechanism configured to monitor and synchronize the substrate motion with the interference pattern using the beam phase controller and the displacement sensor.

2. The system of claim 1, wherein the substrate motion occurs in N Cartesian dimensions and the system comprises of at least N+1 electromagnetic beams.

3. The system of claim 2, wherein the substrate motion is translational, and the feedback control mechanism synchronizes the interference pattern orthogonal to a direction of translational substrate motion.

4. The system of claim 2, wherein the substrate motion is rotational, and the feedback control mechanism synchronizes the interference pattern orthogonal to a direction of rotational substrate motion.

5. The system of claim 1, wherein the substrate is a photosensitive material.

6. The system of claim 5, wherein the substrate is reactive to exposure to the interference pattern when incident on a surface of the substrate thereby transforming the substrate into a patterned substrate.

7. The system of claim 6, further comprising depositing a material into a defined patterned void of the patterned substrate.

8. The system of claim 1, wherein the feedback control mechanism is comprised of a mirror rigidly attached to a reference frame, as compared to the substrate motion, and the phase controller comprises of a spatial distance an electromagnetic beam travels from emitter to substrate, such that the interference pattern created by the electromagnetic beam reflected off of the mirror is rigidly coupled at least indirectly to the substrate and thereby synchronized with the substrate motion.

9. The system of claim 1, wherein a subset of the electromagnetic beams has a beam phase controller controlled by the feedback control mechanism that adjusts the phases of the subset of the electromagnetic beams in accordance to the substrate displacement.

10. The system of claim 9, wherein the beam phase controller further controls polarization and amplitude of the subset of the electromagnetic beams.

11. The system of claim 1, wherein substrate motion occurs in three-dimensions; wherein there are six electromagnetic beams; wherein the beam phase controller comprises of electro-optic phase modulators for five of the electromagnetic beams; and the displacement sensor uses interferometry to measure substrate displacement.

12. The system of claim 1, wherein the substrate is a non-solid substrate.

* * * * *